(12) United States Patent
Lu et al.

(10) Patent No.: US 6,680,544 B2
(45) Date of Patent: Jan. 20, 2004

(54) FLIP-CHIP BUMP ARRANGEMENT FOR DECREASING IMPEDANCE

(75) Inventors: Hsueh-Chung Shelton Lu, Taipei (TW); Kenny Chang, Taipei (TW); Jimmy Huang, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/061,247

(22) Filed: Feb. 4, 2002

(65) Prior Publication Data

US 2002/0190390 A1 Dec. 19, 2002

(30) Foreign Application Priority Data

Jun. 13, 2001 (TW) ........................................ 90114351 A

(51) Int. Cl.⁷ .............................................. H01L 29/40
(52) U.S. Cl. ........................ 257/786; 257/773; 257/776
(58) Field of Search .................. 257/786, 773, 257/776

(56) References Cited

U.S. PATENT DOCUMENTS 5,719,449 A * 2/1998 Strauss ........................ 257/786
6,037,677 A * 3/2000 Gottschall et al. ............. 307/43
6,225,143 B1 * 5/2001 Rao et al. .................... 438/106

\* cited by examiner

*Primary Examiner*—David L. Talbott
*Assistant Examiner*—Luan Thai
(74) *Attorney, Agent, or Firm*—Troxell Law Office PLLC

(57) ABSTRACT

A bump arrangement of a flip-chip is disclosed. The bump arrangement comprises: a conductive bumps array formed at a core region of the flip-chip, a first ring of conductive bumps surrounding the conductive bumps array, a second ring surrounding the first ring, a third ring surrounding the second ring, and a fourth ring surrounding the third ring. In the four rings of bumps, the bumps of the third ring and the fourth ring are staggered each other and most of them are provided for I/O signal terminal so as to reduce the length conductive traces for I/O signal connection. The bumps in the first and the second ring are provided for power connection or ground connection. The first ring, the second ring, the third ring, the fourth ring and the bump at the core region are connected to conductive traces of an interconnection layer through a redistribution layer. The redistribution layer is located in between a passivation layer and the interconnection layer.

9 Claims, 3 Drawing Sheets

FLIP-CHIP BUMP ARRANGEMENT FOR DECREASING IMPEDANCE

FIELD OF THE INVENTION

The present invention relates to a package technique for an integrated circuit chip, especially relates to the bump arrangement for a flip-chip so as to decrease conductive trace impedance and improve the transferring quality of high frequency signals.

BACKGROUND OF THE INVENTION

With the alternation of the fabricating technology generation for integrated circuits (IC), a single chip having multi-functions are common. A single chip is thus having high integrity of devices. Consequently, the advance of the package techniques to adapt the IC development becomes a trend. The conductive wire used to connect between lead frame and bonding pad of the chip appeared to be poor for a chip of VLSI type, not to mention for ULSI.

It is because the package method of using wires stitched to the bonding pads requires to be improving. In the case of wire boding chip, the bonding pads have to form at the border region of a chip so as to prevent the gold wires from shifting due to wires too long or inject the resin into mold. As a consequence, the longer conductive trace to connect between devices and bonding pads cannot be evaded. In addition, with the functions prompted and the prevalence of the performance of high speed, the number of I/O terminals is increased significantly. The conventional fashion of wires stitch to bonding pads associated with high inductance impedance is no longer suitable for the requirements of the chip merits with high performance IC for nowadays and future's.

Therefore, a package technique for IC chip called flip-chip is developed in accordance with the need described above. The technique, please refer to FIG. 1, a conductive bumps 24 array on the top-layer of the chip 20 is shown. The conductive bumps 24, are not limited to form in the surrounding of the device region of the chip, but are distributed on the chip 20 evenly by an array form. The chip 20 is then flipped to make the chip face down so that the conductive bump array 24 connected to the corresponding pads 28 on the substrate 26 which has corresponding conductive pads (or called flip-chip bump pad) 28.

For a chip designed as a flip-chip or as a wire-bonding chip type, the bumps in the core region are almost indifference. For a wire-bonding chip, a passivation layer formed atop chip except the bonding pads, which are distributed in the border of the chip. The devices would not be formed at a substrate region right below the bonding pads. For a flip-chip, a conductive trace layer as a redistribution layer is formed on the passivation layer through the steps of metal deposition, lithography and etching steps. The conductive traces of the redistribution layer connect between the bonding pads in surrounding of the chip and the bump in the chip core. Therefore, for IC designed houses are concerned, the currently design tools for the wire bonding chip could be used for a flip-chip designation.

FIG. 2 shows a conventional cross-sectional view of a flip-chip. The elementary structure containing from the bottom to the top are: a poly-silicon layer (a device gate or a conductive layer) 40, a first inter-level dielectric layer 50A, a first inter-level conductive layer 60A, a second inter-level dielectric layer 50B, a second inter-level conductive layer 60B, a third inter-level dielectric layer 50C, a third inter-level conductive layer 60C, and a passivation layer 70. The contact 55A and the vias 55B and 55C are, respectively, used to connect in between the polycrystalline silicon layer 40 and the first 60A, the first 60A and the second 60B, the second 60B and the third inter-level conductive layers 60C. Atop the passivation layer 70 has a fourth conductive layer, which serves as redistribution layer for the connections in between boding pads and the predetermined bumps position at the chip core. The bumps are then formed through screen-printing to bond bump 95 or through a method of electroplating which are used to deposit the solder bumps 95 on the patterned passivation film 92.

The conductive bumps aforementioned are all arranged as array type. Furthermore, no matter conductive bumps are of signal or of connecting ground or of source-voltage type, the arrangement is in mixing in each columns and rows. The length of each conductive trace for signal connection may be longer or shorter, all determined by the distances in between bonding pads originally designed for wire bonding chip and the conductive bumps of chip core. FIG. 3 shows a synoptic top view, which shows the power pad p at surrounding region of the chip connecting to the bump 98 at the core region by a conductive trace of the RDL layer 97. The ground pad g and the signal pad s at surrounding region of the chip are being connected to the ground bump G or signal bump S through trace 97. Thus the inductance due to the bended conductive trace and the traces in between are significantly.

The object of the present invention is thus proposed an arrangement for signal bump so that the impedance of the conductive trace can be decreased.

SUMMARY OF THE INVENTION

An object of the present invention is to provide a bump arrangement so as to reduce the impedance of conductive traces for signal bump connections.

A bump arrangement of a flip-chip is disclosed. The bump arrangement comprises: a conductive bumps array formed at a core region of the flip-chip, a first ring of conductive bumps of surrounding the conductive bumps array, a second ring of conductive bumps surrounding the first ring, a third ring surrounding the second ring, and a fourth ring surrounding the third ring. In the four rings of bumps, the bumps arrangement in the third ring and the fourth ring are staggered each other and most of them are provided for I/O signal terminal so as to reduce the length conductive traces for I/O signal connection. The bumps in the first and the second ring are provided for power connection or ground connection. The conductive bumps of the first ring, the second ring, the third ring, the fourth ring and the bump at the core region are connected to conductive traces of an interconnection layer through a redistribution layer, which has conductive traces and wherein the redistribution layer are at a position in between a passivation layer and the interconnection layer.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DETAILED DESCRIPTION OF THE PREFERRED EMBODIMENT

For a flip-chip designation, depicted in forgoing prior art of background of invention, signal conductive bumps, ground conductive bumps and power conductive bumps are usually mixed arranged in each row or column. Therefore, some of the conductive trace in redistribution layer (RDL) for signal conductive bumps would have higher impedance. The method is proposed to settle forgoing problems.

Figure 1:
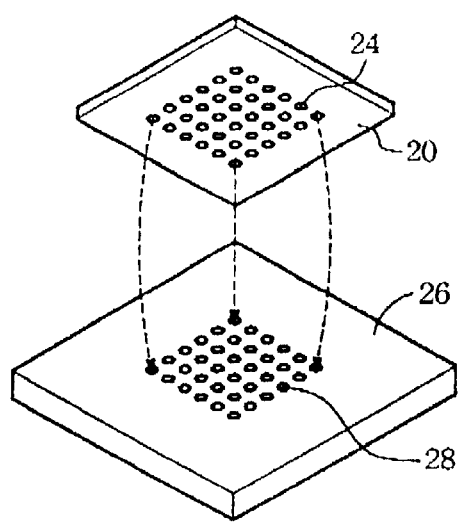
FIG. 1. is a view of flip-chip IC package technique, each of the conductive bumps of flip-chips corresponding to pad of substrate.
Figure 2:
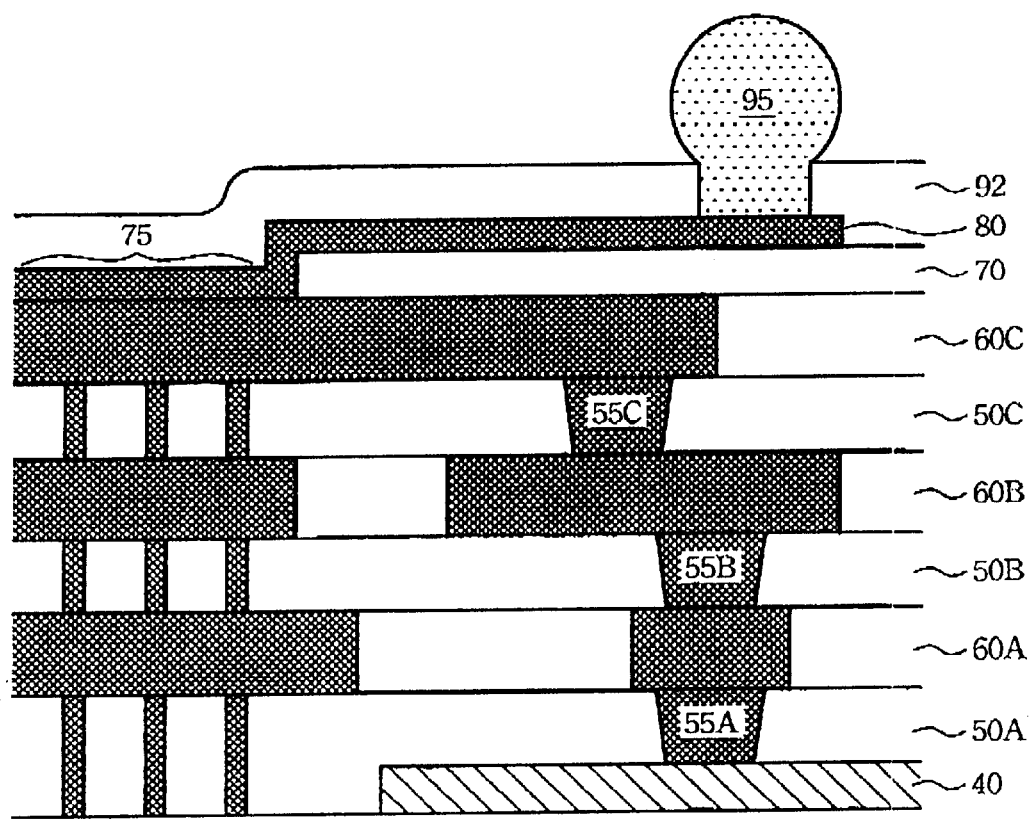
FIG. 2. is a cross-sectional view of level of the interconnection, bonding pads, and bump of a flip-chip in accordance with the prior art.
Figure 3:
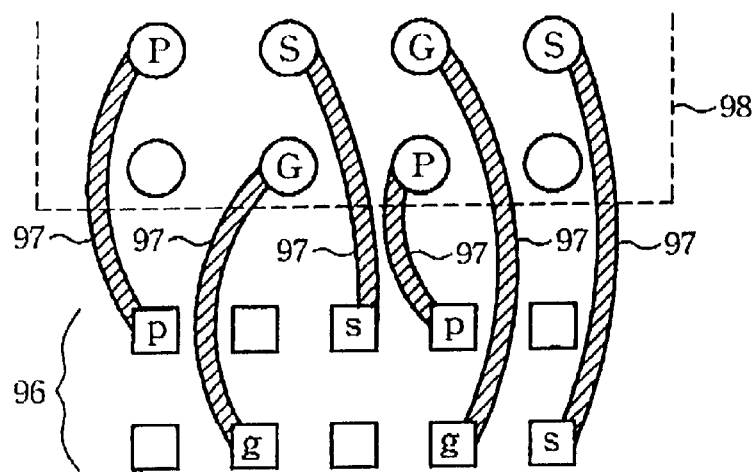
FIG. 3. is a view of a flip-chip of redistribution layers RDL connecting with VSS, VCC and signals in accordance with the prior art.
Figure 4:
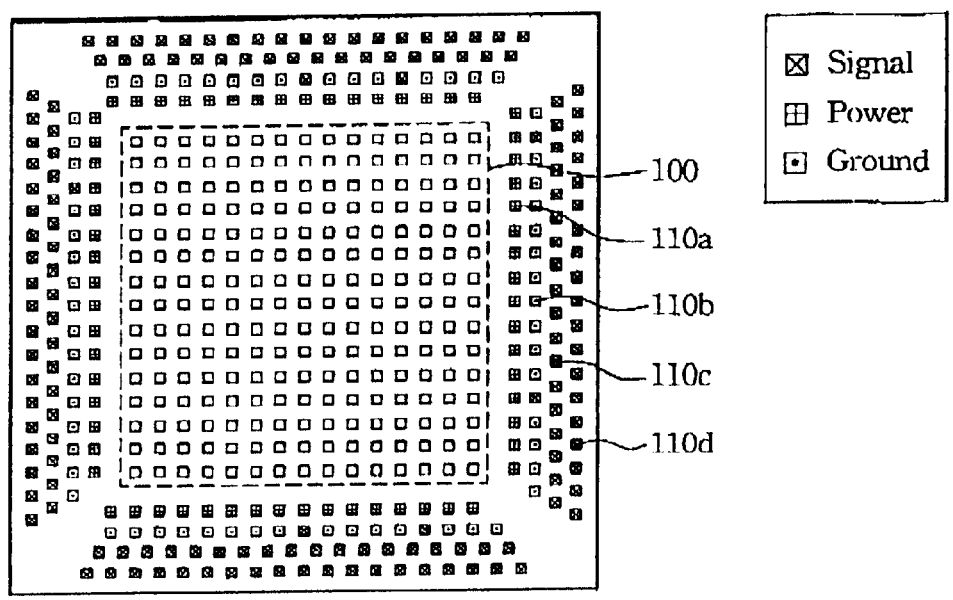
FIG. 4. is a top view of bump arrangement in accordance with the present invention.

Please refer to FIG. 4, which shows the synoptic top-view of conductive bumps in accordance with the invention. The chip core region 100 of flip-chip contains core voltage bumps and core ground bumps, which are distributed in array form. The surrounding of the core region 100 comprises four rings of conductive bumps. The four rings in accordance with the functions served from inner portion to outer portion are, respectively, conductive bumps 110a for power rings VCC, conductive bumps 110b for ground ring VSS and conductive bumps 110c, 110d for I/O signals. It is noted that the outer two rings are arranged in a form of staggered from each other. The staggered form has benefits of reducing the inductance impedance of signal bump pads, especially, for bumps as high frequency input/output pads.

For the resistance reduction of the signal bump, the redistribution layer (RDL) of the present invention is put in a position different from that of prior art. Taking three interconnection layers M1, M2, M3 as an example, the passivation layer and openings for bond pads are formed thereon the M3 interconnection layer. The RDL layer then forms on the passivation layer so as to connect the bump pads formed thereafter on the chip core. The method of the present invention proposed, however, is to have the RDL layer formed before the passivation layer. The region originally prepared for bonding pads on M3 interconnection layer is canceled. The substrate just below the surrounding region of the chip can then be designed for layout of capacitors, electrostatic-discharge-prevent devices or inductors.

Figure 5:
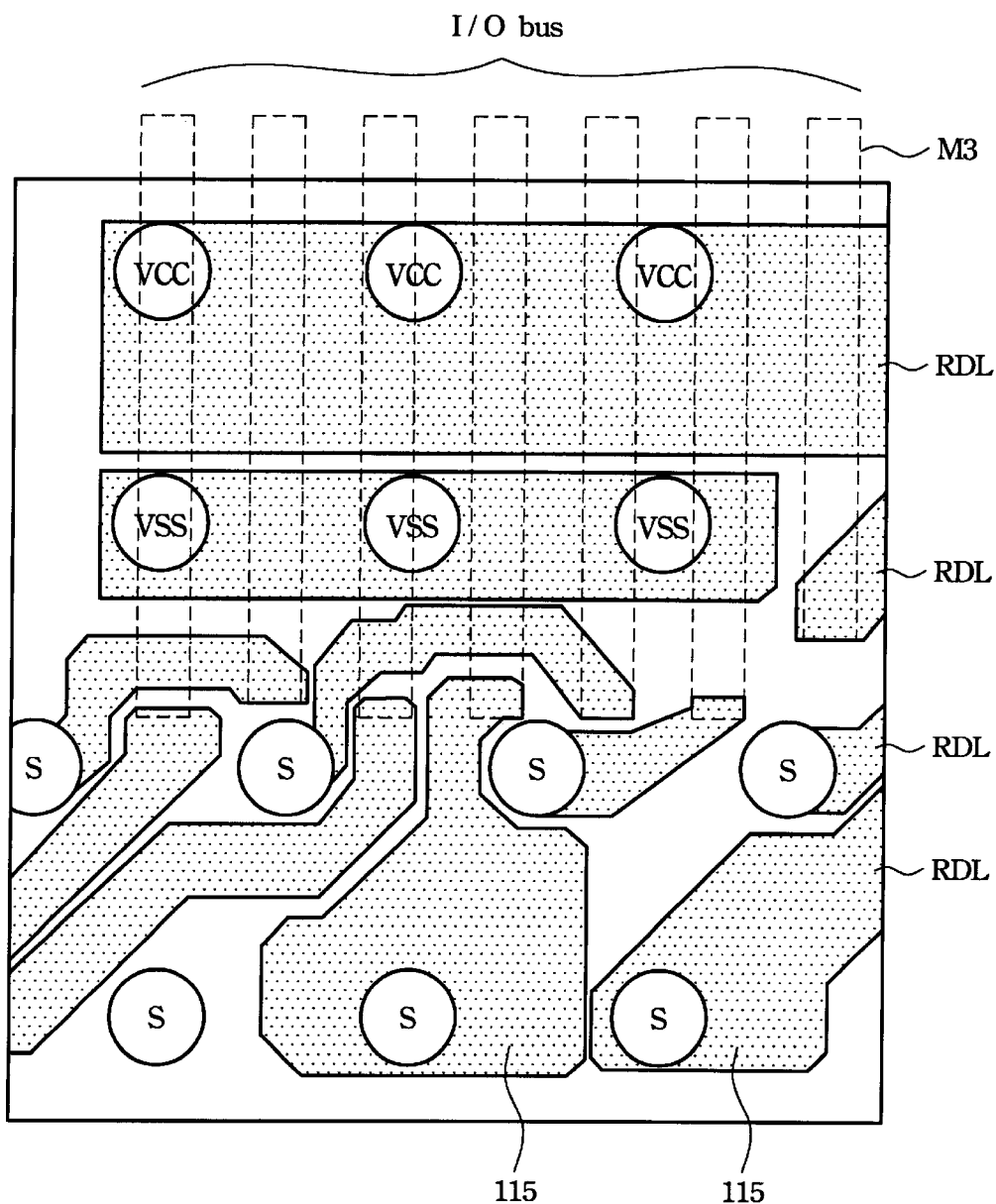
FIG. 5. is a view of four row of the conductive bumps of the flip-chip; worth to note that the signal bumps at outer rows are staggered each other in accordance with the present invention.

The rerouting of the conductive tracer defined in the RDL layer is according to the positions of the signal buffer of input/output (I/O bus) and the voltage/ground bus where I/O bus and voltage/ground bus are located on the interconnection layer M3, as shown in FIG. 5. Therefore, as the signal bump set at the border region, the length of the conductive traces in between the I/O signal terminals and the signal bumps decreased are anticipated. Particularly, for conventional wire bonding chip, the conductive trace for signal bump connection has been formed and has come to the border region of the chip where the region is for bonding pads of the wire-bonding chip. Thus, as the signal bump pads arranged right near such region in accordance, the benefits are obvious. It is noted that FIG. 5, shows M3 and RDL layer thereabove. The interconnection layer M3 includes I/O bus and power/ground bus therein and RDL layer shows only a portion of four rows of conductive bumps. In FIG. 5, one row for power bumps VCC, one row for ground bumps VSS, and two rows for signal bumps S.

The preferred embodiment depicted above is to illustrate the present invention not to limit the claim scope of the present invention. For example, the arrangement for I/O signal is set at the most outer ring ($4^{th}$ ring) of bumps as the first priority, and then the third ring as the second priority. The sequences of priorities for I/O signal are decreased with near the core of the chip. In other words, a few of the power bumps or ground bumps may be arranged at the $4^{th}$ or the $3^{rd}$ ring if necessary. Surely, some I/O signal bumps may be arranged at $1^{st}$ or $2^{nd}$ ring if the outer two rings are not enough for all signals. However, the number of I/O signal bumps arranged at inner ring should lower than that of outer ring.

Furthermore, according to the present invention, the power bumps can be connected to the power bus through the via if the projection of the power bump is intersected with the power bus. The power bumps can be connected to the ground bus through the via if the projection of the ground bump is intersected with the ground bus. The conductive trace in the RDL layer is further decreased.

Naturally, when the flip-chip bumps have been changed as above, the bump pads of substrate for flip-chip bump supporting will thus be changed as stated before.

While the embodiment of the invention has been illustrated as described as above, it will be appreciated that various changes can be made there in without departing from the spirit and scope of the invention further the protecting range of patent will see the attached application of the range of patent and its equivalent area them determine.

What is claimed is:

1. A bump arrangement of a flip-chip comprising:
    a conductive bump array formed at a core of said flip-chip;
    a first ring of conductive bumps surrounding said conductive bump array, most portions of said first ring of conductive bumps being connected responsively to power terminals;
    a second ring of conductive bumps surrounding said first ring, each of conductive bumps of said first ring having a conductive bump of said second ring aligned therewith, and most portions of said second ring of conductive bumps being connected responsively to a ground terminal; and
    a third ring of conducive bumps surrounded and staggered with respect to said second ring of conductive bumps, most portions of said conductive bumps of said third ring being connected to I/O signal terminals, and said third ring, said second ring, and said first ring of conductive bumps being connected to conductive traces of at least one interconnection layer through vias and a redistribution layer, wherein said redistribution layer is interposed between a passivation layer and the most upper interconnection layer of said at least one interconnection layer.

2. The arrangement according to claim 1 and further comprising a fourth ring of conductive bumps surrounding said third ring of conductive bumps, each conductive bumps in said third ring are staggered each other with conductive bumps in said fourth ring.

3. The arrangement according to claim 2, wherein most portions of said conductive bumps of said fourth ring being connected to I/O signal terminals.

4. The arrangement according to claim 2, wherein said I/O signal terminals of said flip-chip have a first priority arranged at said fourth ring, a second priority arranged at said third ring, a third priority arranged at said second ring and have least priority formed at said first ring.

5. The arrangement according to claim 1, wherein said conductive bumps array formed at the core region of said flip-chip is to connect responsively to various core voltages or a ground voltage.

6. The arrangement according to claim 1, wherein said first ring, said second ring, said third ring, and fourth ring are formed over and close to edge regions of a semiconductor substrate region, where said edge regions having at least one selected from the group consisting of capacitors, electrostatic-discharge-prevent devices, inductors, and a combination thereof.

7. A bump arrangement of a flip-chip comprising:

a conductive bump array formed at a core of said flip-chip;

a first ring of conductive bumps surrounding said conductive bump array, most portions of said first ring of conductive bumps being connected responsively to power terminals;

a second ring of conductive bumps surrounded said first ring, each of conductive bumps of said first ring having a conductive bump of said second ring aligned therewith, and most portions of said second ring of conductive bumps being connected responsively to a ground terminal;

a third ring of conducive bumps surrounded and staggered with respect to said second ring of conductive bumps; and a fourth ring of conductive bumps surrounded and staggered each other with conductive bumps in said third ring, said first ring, said second ring, third ring and said fourth ring of conductive bumps being connected to conductive traces of interconnection layers through vias and a redistribution layer wherein said redistribution layer is interposed between a passivation layer and a most upper interconnection layer of said interconnection layers, still wherein said fourth ring of conductive bumps, said third ring of conductive bumps, said second ring of conductive bumps, said first ring of conductive bumps has the priorities to connect with I/O signals decreasing with near said core of said flip-chip.

8. The arrangement according to claim 7, wherein said first ring, said second ring, said third ring, and fourth ring are formed over and close to edge regions of a semiconductor substrate region, where said edge regions can provide for capacitors or electrostatic-discharge-prevent devices or inductor or a combination thereof formed thereon.

9. The arrangement according to claim 7, wherein said conductive bumps array formed at the core region of said flip-chip is to connect responsively to various core voltages or a ground voltage.

* * * * *